(12) United States Patent
Xing

(10) Patent No.: US 10,431,743 B2
(45) Date of Patent: Oct. 1, 2019

(54) MANUFACTURING METHOD OF AN OLED ANODE AND AN OLED DISPLAY DEVICE THEREOF

(71) Applicant: Wuhan China Star Optoelectronics Technology Co., Ltd., Wuhan, Hubei (CN)

(72) Inventor: Lei Xing, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 40 days.

(21) Appl. No.: 15/744,818

(22) PCT Filed: Nov. 20, 2017

(86) PCT No.: PCT/CN2017/111885
§ 371 (c)(1),
(2) Date: Jan. 14, 2018

(87) PCT Pub. No.: WO2019/085045
PCT Pub. Date: May 9, 2019

(65) Prior Publication Data
US 2019/0131529 A1  May 2, 2019

(30) Foreign Application Priority Data
Oct. 30, 2017 (CN) .......................... 2017 1 1052745

(51) Int. Cl.
H01L 51/00 (2006.01)
H01L 51/52 (2006.01)
(Continued)

(52) U.S. Cl.
CPC ...... H01L 51/0017 (2013.01); H01L 21/0273 (2013.01); H01L 21/47 (2013.01);
(Continued)

(58) Field of Classification Search
CPC . H01L 21/0273; H01L 21/47; H01L 51/0017; H01L 51/0008; H01L 31/022475
(Continued)

(56) References Cited

U.S. PATENT DOCUMENTS

| 2013/0001594 A1* | 1/2013 | Crankshaw | ......... H01L 27/3283 257/79 |
| 2013/0112958 A1* | 5/2013 | Li | ....................... H01L 27/3211 257/40 |

(Continued)

*Primary Examiner* — Binh X Tran
(74) *Attorney, Agent, or Firm* — Hauptman Ham, LLP

(57) ABSTRACT

A manufacturing method of an OLED anode and display device are provided, which the former method comprises the steps: forming an anode-film layer, a material is an ITO, on a substrate; forming a photoresist-film layer on the anode-film layer; patterning the photoresist-film layer to acquire a photoresist-mask pattern, which comprises: an area of photoresist full-retention, photoresist half-retention, and a photoresist full-removal, wherein the photoresist area of half-retention is located between the full-retention and the full-removal; etching the anode film layer to acquire an anode pattern; removing the photoresist half-retention area; perform a plasma treatment to a portion of the anode pattern outside the photoresist full-retention area by adopting a first gas, comprising at least one of $O_2$, $N_2O$, $CF_4$, Ar; removing the photoresist-mask pattern. The disclosure increases the small thickness portion of brightness to compensate for the display unevenness caused by the thickness difference and improve the display quality.

20 Claims, 7 Drawing Sheets

(51) Int. Cl.
  *H01L 27/32* (2006.01)
  *H01L 51/56* (2006.01)
  *H01L 21/027* (2006.01)
  *H01L 21/47* (2006.01)

(52) U.S. Cl.
  CPC ...... *H01L 27/3246* (2013.01); *H01L 51/0008* (2013.01); *H01L 51/5206* (2013.01); *H01L 51/56* (2013.01)

(58) Field of Classification Search
  USPC ..................................... 216/67, 71, 75, 76
  See application file for complete search history.

(56) References Cited

U.S. PATENT DOCUMENTS

| | | | |
|---|---|---|---|
| 2014/0291636 A1* | 10/2014 | Kim | H01L 27/3262 257/40 |
| 2017/0222147 A1* | 8/2017 | Defranco | G03F 7/3021 |
| 2017/0222148 A1* | 8/2017 | Defranco | G03F 7/40 |
| 2018/0034007 A1* | 2/2018 | He | H01L 51/56 |
| 2018/0226604 A1* | 8/2018 | Gong | H01L 51/5203 |

\* cited by examiner

MANUFACTURING METHOD OF AN OLED ANODE AND AN OLED DISPLAY DEVICE THEREOF

RELATED APPLICATIONS

The present application is a National Phase of International Application Number PCT/2017/111885, filed on Nov. 20, 2017, and claims the priority of China Application No. 201711052745.2, filed on Oct. 30, 2017.

FIELD OF THE DISCLOSURE

The disclosure relates to a display technical field, and more particularly to a manufacturing method of an OLED anode and a manufacturing method of an OLED display device.

BACKGROUND

An organic light-emitting diode (OLED) display device is a device that utilizes a reversible discoloration phenomenon generated by driving an organic semiconductor material under a current to realize a graphical display. The OLED display has advantages of ultra-light, ultra-thin, high brightness, large viewing angle, low voltage, low power consumption, fast response, high definition, shockproof, flexible, low cost, simple process, raw used materials, high luminous efficiency and wide temperature range and so on; therefore, an OLED display technology is considered as the most promising new generation of a display technology.

A basic structure of the OLED display device comprises: an anode layer, a cathode layer, and an organic light-emitting layer between the anode layer and the cathode layer. Generally, the organic light-emitting layer is deposited on the anode layer through an evaporation process. However, at the time of performing the evaporation, because an upper limit of an angle of an evaporation source is present, an evaporated organic light-emitting layer tends to be uneven. Specifically, as shown in FIG. 1, the anode layer 4' is connected to a drain electrode 2' covered by a flat layer 3' through the flat layer 3'. A thickness of a material at both end areas of the organic light-emitting layer 6' on the anode layer 4' (that is, at the b' area shown in FIG. 1) is thinner than the thickness of the material of a central region (that is, at the a' area shown in FIG. 1), which the flat layer 3' is below the anode layer 4'. As a result, when the OLED emits light, it is prone to present the situations that a light-emitting unit around emits the light unsaturated and a brightness is lower than the light-emitting unit of the central region as shown in FIG. 2, resulting in an OLED light color mixing, and affecting an effect of the display.

SUMMARY

In order to solve an above technical problem, a present disclosure provides a manufacturing method of an OLED anode and a manufacturing method of an OLED display device, which can increase a brightness of a smaller thickness portion of an organic light emitting layer, and compensate for a display unevenness caused by a difference of the thickness of the organic light-emitting layer, and improve a display quality.

The present disclosure provides the manufacturing method of an OLED anode, wherein comprising following steps:

Forming an anode film layer on a substrate, wherein a material of the anode film layer is an ITO material;

Forming a photoresist film layer on the anode film layer;

Patterning the photoresist film layer to acquire a photoresist-mask pattern, the photoresist-mask pattern comprising: a photoresist full-retention area, a photoresist half-retention area, and a photoresist full-removal area, wherein the photoresist half-retention area is located between the photoresist full-retention area and the photoresist full-removal area;

Using the photoresist-mask pattern as an anti-etching layer, and etching the anode film layer to acquire an anode pattern;

Removing the photoresist half-retention area;

Performing a plasma treatment to a portion of the anode pattern outside the photoresist full-retention area by adopting a first gas, wherein, the first gas comprises at least one of an $O_2$, $N_2O$, $CF_4$, and Ar; and Removing the photoresist-mask pattern.

Preferably, patterning the photoresist film layer is specifically as:

Using a semi-transparent mask or a gray mask to expose and develop the photoresist film layer.

Preferably, forming the anode film layer on the substrate is specifically as:

Preparing the anode film layer on the substrate by a magnetron sputtering and a thermal evaporation process.

Preferably, etching the anode film layer is specifically as:

Etching the anode film layer by a wet-etching process.

Preferably, removing the photoresist half-retention area is specifically as:

Performing a plasma-ashing treatment to the photoresist-mask patter by adopting a second gas, and removing the photoresist half-retention area, wherein the second gas is a mixed gas of $SF_6$ and $O_2$.

Preferably, performing a plasma-ashing treatment to the photoresist-mask patter by adopting a second gas is specifically as:

Transporting the second gas to a plasma etching apparatus, and using the plasma etching apparatus to ionize the second gas, and performing the plasma-ashing treatment to the photoresist-mask patter by adopting an ionized second gas with a processing time of 30~50 seconds;

Wherein a top electrode power, a bottom electrode power and a chamber pressure of the plasma etching apparatus are respectively set as 6000~8000 W, 6000~8000 W and 200~250 mT, and a gas flow rate of $SF_6$ and $O_2$ in the second gas are 50-150 sccm and 5000-7000 sccm, respectively.

Preferably, performing a plasma treatment to a portion of the anode patter outside the photoresist full-retention area by adopting a first gas is specifically as:

Transporting the first gas to the plasma etching apparatus, and using the plasma etching apparatus to ionize the first gas, and performing the plasma treatment to the portion of the anode pattern outside the photoresist full-retention area by adopting an ionized first gas with a processing time of 1~3 minutes to increase a work function of the portion of the anode film layer outside the photoresist full-retention area;

Wherein the top electrode power, a bottom electrode power and a chamber pressure of the plasma etching apparatus are respectively set as 1000~5000 W, 0 W and 100-300 mT, and a gas flow rate of the first gas is 1000~5000 sccm.

The present disclosure further provides the manufacturing method of an OLED anode, wherein comprising following steps:

Forming the anode film layer on the substrate, wherein the material of the anode film layer is the ITO material;

Forming the photoresist film layer on the anode film layer;

Patterning the photoresist film layer to acquire the photoresist-mask pattern, the photoresist-mask pattern comprising: the photoresist full-retention area, the photoresist half-retention area, and the photoresist full-removal area, wherein the photoresist half-retention area is located between the photoresist full-retention area and the photoresist full-removal area;

Using the photoresist-mask pattern as an anti-etching layer, and etching the anode film layer to acquire an anode pattern;

Removing the photoresist half-retention area;

Performing the plasma treatment to the portion of the anode pattern outside the photoresist full-retention area by adopting the first gas, wherein, the first gas comprises at least one of the $O_2$, $N_2O$, $CF_4$, and Ar, and Removing the photoresist-mask pattern.

Removing the photoresist half-retention area;

Performing the plasma-ashing treatment to the photoresist-mask patter by adopting the second gas, and removing the photoresist half-retention area, wherein the second gas is the mixed gas of $SF_6$ and $O_2$.

Preferably, patterning the photoresist film layer is specifically as:

Using the semi-transparent mask or the gray mask to expose and develop the photoresist film layer.

Preferably, forming the anode film layer on the substrate is specifically as:

Preparing the anode film layer on the substrate by the magnetron sputtering and the thermal evaporation process.

Preferably, etching the anode film layer is specifically as:

Etching the anode film layer by the wet-etching process.

Preferably, performing the plasma-ashing treatment to the photoresist-mask pattern by adopting the second gas is specifically as:

Transporting the second gas to the plasma etching apparatus, and using the plasma etching apparatus to ionize the second gas, and performing the plasma-ashing treatment to the photoresist-mask pattern by adopting the ionized second gas with the processing time of 30~50 seconds;

Wherein the top electrode power, the bottom electrode power and the chamber pressure of the plasma etching apparatus are respectively set as 6000~8000 W, 6000~8000 W and 200~250 mT, and the gas flow rate of $SF_6$ and $O_2$ in the second gas are 50-150 sccm and 5000-7000 sccm, respectively.

Preferably, performing the plasma treatment to the portion of the anode pattern outside the photoresist full-retention area by adopting the first gas is specifically as:

Transporting the first gas to the plasma etching apparatus, and using the plasma etching apparatus to ionize the first gas, and performing the plasma treatment to the portion of the anode pattern outside the photoresist full-retention area by adopting the ionized first gas with the processing time of 1~3 minutes to increase the work function of the portion of the anode film layer outside the photoresist full-retention area;

Wherein the top electrode power, the bottom electrode power and the chamber pressure of the plasma etching apparatus are respectively set as 1000~5000 W, 0 W and 100-300 mT, and the gas flow rate of the first gas is 1000~5000 sccm.

The present disclosure further provides the manufacturing method of an OLED display device, comprising following steps:

Forming a TFT array layer on the substrate;

Forming a flat layer on the substrate, and the flat layer covering the TFT array layer;

Forming a hole on the flat layer;

Preparing an anode on the flat layer, and the anode electrically connects to the TFT array layer through the hole;

Forming a pixel defining layer on the anode;

Forming an organic light-emitting layer on the pixel defining layer;

Forming a cathode on the organic light-emitting layer;

Wherein preparing the anode on the flat layer comprises the following steps:

Forming an anode film layer on the substrate, wherein a material of the anode film layer is the ITO material;

Forming a photoresist film layer on the anode film layer;

Patterning the photoresist film layer to acquire the photoresist-mask pattern, the photoresist-mask pattern comprising: the photoresist full-retention area, the photoresist half-retention area, and the photoresist full-removal area, wherein the photoresist half-retention area is located between the photoresist full-retention area and the photoresist full-removal area;

Using the photoresist-mask pattern as the anti-etching layer, and etching the anode film layer to acquire an anode pattern;

Removing the photoresist half-retention area;

Performing the plasma treatment to the portion of the anode pattern outside the photoresist full-retention area by adopting the first gas, wherein, the first gas comprises at least one of the $O_2$, $N_2O$, $CF_4$, and Ar, and Removing the photoresist-mask pattern.

Preferably, forming the pixel defining layer on the anode comprises the following steps:

Forming an organic insulating resin layer on the anode;

Acquiring the pixel defining layer by lithographically exposing the organic insulating resin layer;

Forming the cathode on the organic light-emitting layer is specifically as:

Forming the cathode on the organic light-emitting layer by an evaporation method;

Electrically connecting between the anode and the TFT array layer through the hole is specifically as:

Electrically drain electrode connecting between the anode and the TFT array layer through the hole.

Preferably, forming the organic light-emitting layer on the pixel defining layer is specifically as:

Forming the organic light-emitting layer on the pixel defining layer by the evaporation method;

The organic light-emitting layer comprises at least one layer of a hole injection layer, a hole transport layer, a light-emitting layer, a hole blocking layer, an electron blocking layer, an electron transport layer and an electron injection layer.

Preferably, patterning the photoresist film layer is specifically as:

Using the semi-transparent mask or the gray mask to expose and develop the photoresist film layer;

Forming the anode film layer on the substrate is specifically as:

Preparing the anode film layer on the substrate by the magnetron sputtering and the thermal evaporation process.

Preferably, etching the anode film layer is specifically as:

Etching the anode film layer by the wet-etching process;

Removing the photoresist half-retention area is specifically as:

Performing the plasma-ashing treatment to the photoresist-mask pattern by adopting the second gas, and removing the photoresist half-retention area, wherein the second gas is the mixed gas of $SF_6$ and $O_2$.

Preferably, performing the plasma-ashing treatment to the photoresist-mask pattern by adopting the second gas is specifically as:

Transporting the second gas to the plasma etching apparatus, and using the plasma etching apparatus to ionize the second gas, and performing the plasma-ashing treatment to the photoresist-mask patter by adopting the ionized second gas with the processing time of 30~50 seconds;

Wherein the top electrode power, the bottom electrode power and the chamber pressure of the plasma etching apparatus are respectively set as 6000~8000 W, 6000~8000 W and 200~250 mT, and the gas flow rate of $SF_6$ and $O_2$ in the second gas are 50-150 sccm and 5000-7000 sccm, respectively.

Preferably, performing the plasma treatment to the portion of the anode pattern outside the photoresist full-retention area by adopting the first gas is specifically as:

Transporting the first gas to the plasma etching apparatus, and using the plasma etching apparatus to ionize the first gas, and performing the plasma treatment to the portion of the anode pattern outside the photoresist full-retention area by adopting the ionized first gas with the processing time of 1~3 minutes to increase the work function of the portion of the anode film layer outside the photoresist full-retention area;

Wherein the top electrode power, the bottom electrode power and the chamber pressure of the plasma etching apparatus are respectively set as 1000~5000 W, 0 W and 100-300 mT, and the gas flow rate of the first gas is 1000~5000 sccm.

An implementation of the present disclosure has following beneficial effects: when the photoresist film layer is patterned, the photoresist half-retention area is disposed between the photoresist full-retention area and the photoresist full-removal area, and the anode film layer corresponding to the photoresist full-removal area is etched away to divide the anode film into a plurality of anode patterns, which the photoresist half-retention area is located above a peripheral area of the anode pattern while the photoresist full-removal area is located above a middle area of the anode pattern (that is, an inner area surrounded by the peripheral area), and the thickness of the organic light-emitting layer over the area around the anode pattern is generally smaller than the thickness of the organic light-emitting layer above the middle of the anode pattern. In the present disclosure, the anode corresponding to the portion with the smaller thickness of the organic light-emitting layer of the OLED display device is adopted the plasma treatment with at least one of $O_2$, $N_2O$, $CF_4$ and Ar to increase the work function of the anode corresponding to the portion with the smaller thickness of the organic light-emitting layer; thereby, promoting the portion of the anode to the injection efficiency of the hole injection layer, increasing the brightness of the smaller thickness portion of the organic light emitting layer, and compensating for the display unevenness caused by the difference of the thickness of the organic light-emitting layer, and improving a display quality.

BRIEF DESCRIPTION OF THE DRAWINGS

To describe the embodiments of the present disclosure or the technical solutions in the prior art more clearly, the following briefly introduces the accompanying figures required for describing the embodiments or the prior art. Apparently, the accompanying figures in the following descriptions show merely some embodiments of the present disclosure, for those skilled in the art, under the premise without paying any creative work, they still can acquire other figures according to these figures.

DETAILED DESCRIPTION OF PREFERRED EMBODIMENTS

Figure 1:
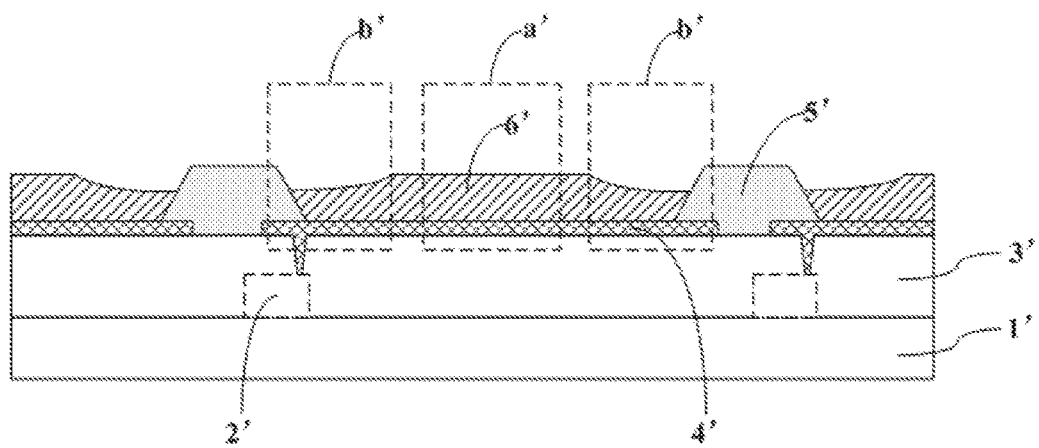
FIG. 1 is a schematic structural diagram of an OLED display device in the background technique provided by the present disclosure.
Figure 2:
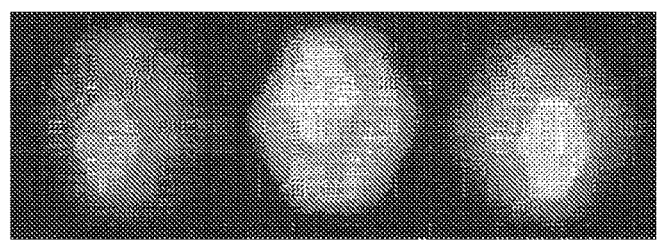
FIG. 2 is a light emitting schematic diagram of an OLED display device in the background technique provided by the present disclosure.
Figure 3:
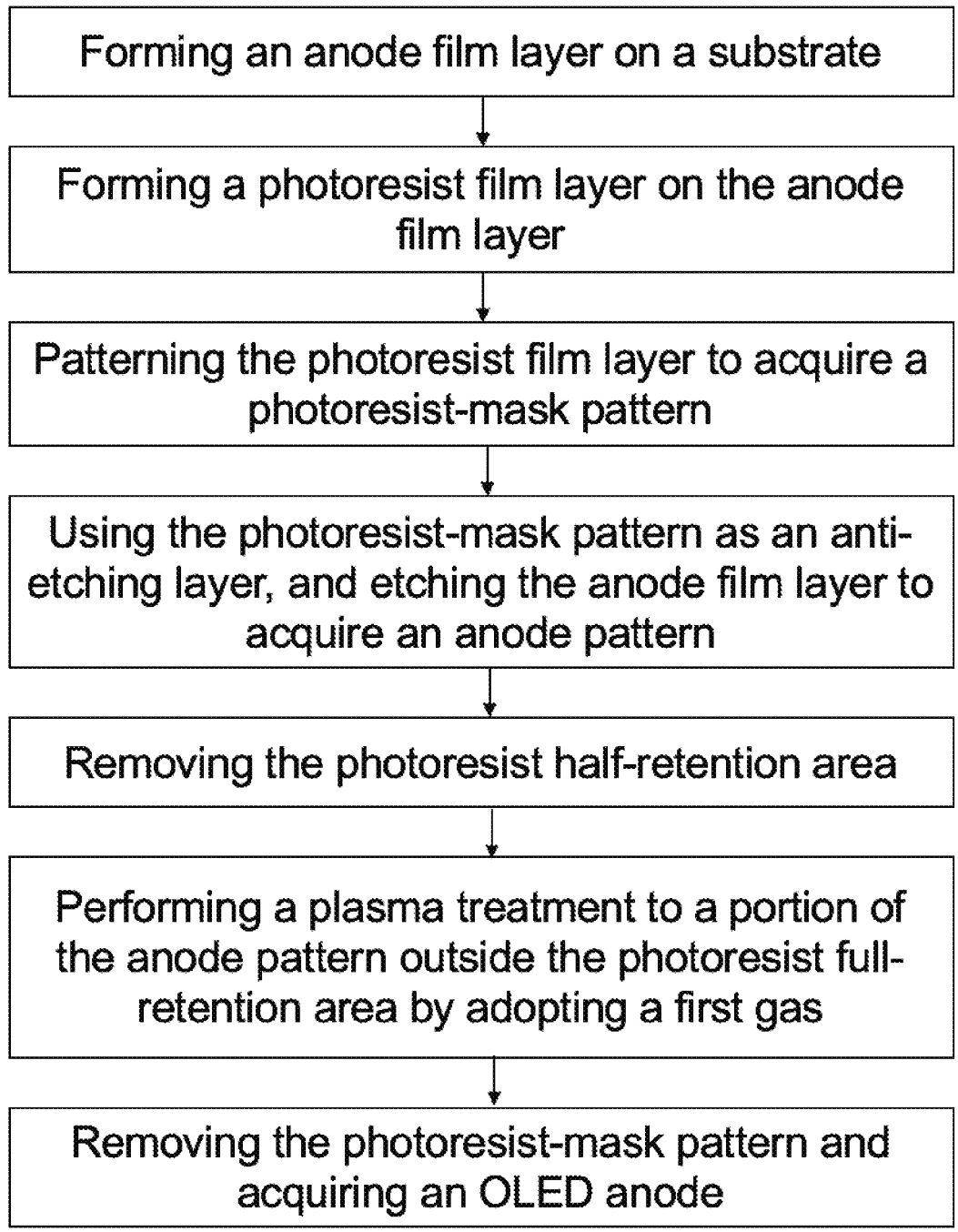
FIG. 3 is a flow chart of a manufacturing method of an OLED anode provided by the present disclosure.
Figure 4A:
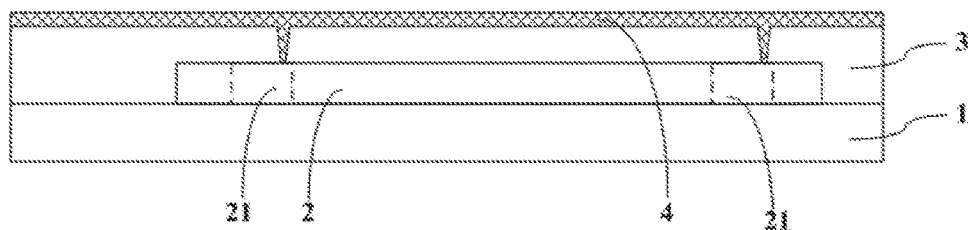
FIG. 4a is a schematic structural diagram of a substrate and an anode film layer in an embodiment provided by the present disclosure.
Figure 4B:
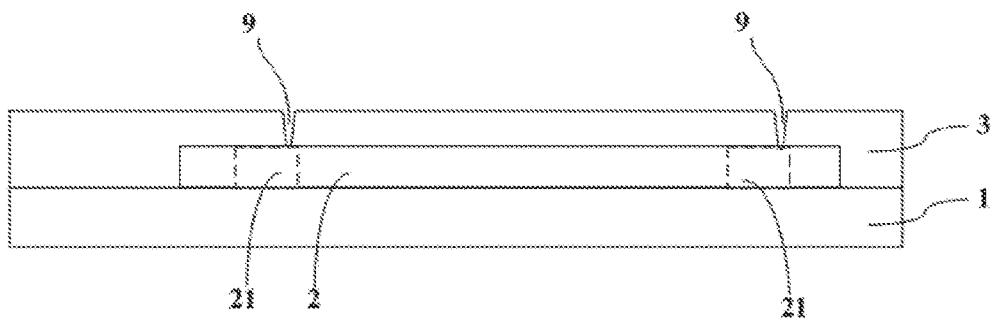
FIG. 4b is a schematic structural diagram of a through-hole provided on a flat layer in an embodiment provided by the present disclosure.

This disclosure provides a manufacturing method of an OLED anode, as shown in FIG. 3, this method comprises the following steps:

As shown in FIG. 4a, a substrate 1 is formed on an anode film layer 4, wherein, a material of the anode film layer 4 is an ITO material, which is an indium tin oxide material; preferably, and a thin film transistor (TFT) array layer and a flat layer 3 are also formed on the substrate 1, and the flat layer 3 covers the TFT array layer 2, and the anode film layer 4 is located above the TFT array layer 2; as shown in FIG. 4b, the flat layer 3 is further disposed with a hole 9 at an upper portion of a drain electrode 21 of the TFT array layer 2. The anode film layer 4 is electrically connected to the drain electrode 21 of the TFT array layer 2 through the hole 9.

Figure 5:
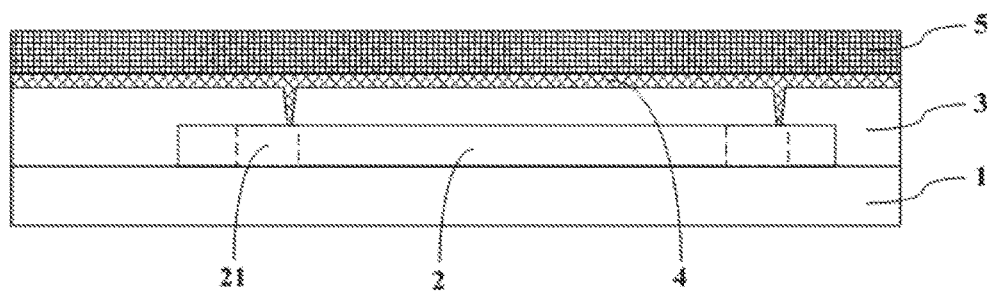
FIG. 5 is a schematic structural diagram of a substrate, an anode film layer and a photoresist film layer in an embodiment provided by the present disclosure.

As shown in FIG. 5, a photoresist film layer 5 is formed on the anode film layer 4, and the photoresist film layer 5 is located above the anode film layer 4; preferably, the photoresist film layer 5 is formed on the anode film layer 4 by coating.

Figure 6:
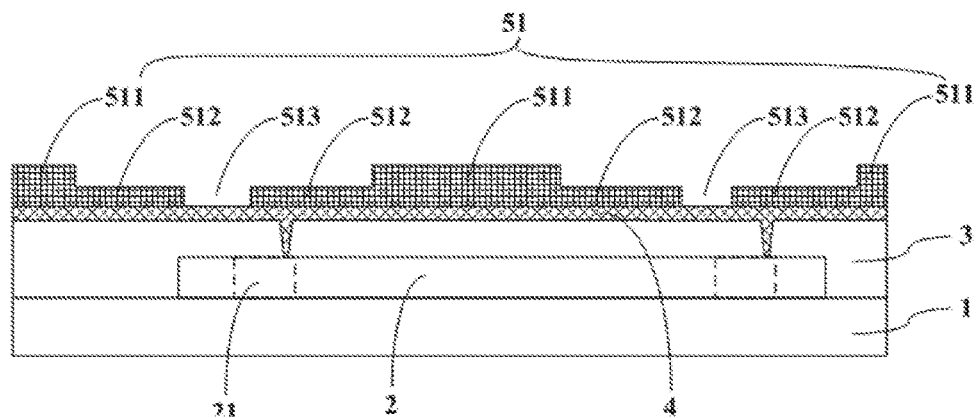
FIG. 6 is a schematic diagram of a photoresist mask pattern acquired by the photoresist film layer in the patterning FIG. 5 provided by the present disclosure.

As shown in FIG. 6, patterning the photoresist film layer 5 acquires a photoresist-mask pattern 51, and the photoresist-mask pattern 51 comprising: a photoresist full-retention area 511, a photoresist half-retention area, 512 and a photoresist full-removal area 513, wherein the photoresist half-retention area 512 is located between the photoresist full-retention area 511 and the photoresist full-removal area 513.

Figure 7:
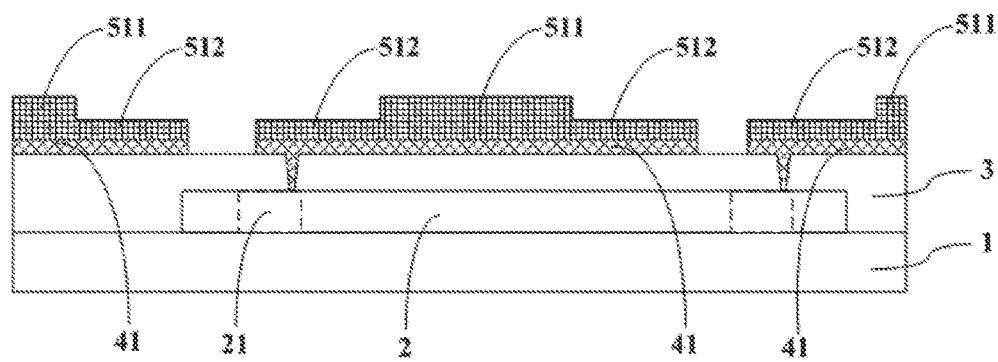
FIG. 7 is a schematic diagram of the anode pattern acquired by etching the anode film layer with a photoresist mask pattern as an anti-etching layer provided by the present disclosure.

As shown in FIG. 7, using the photoresist-mask patter 51 as an anti-etching layer etches the anode film layer to acquire at least two anode patterns 41.

Figure 8:
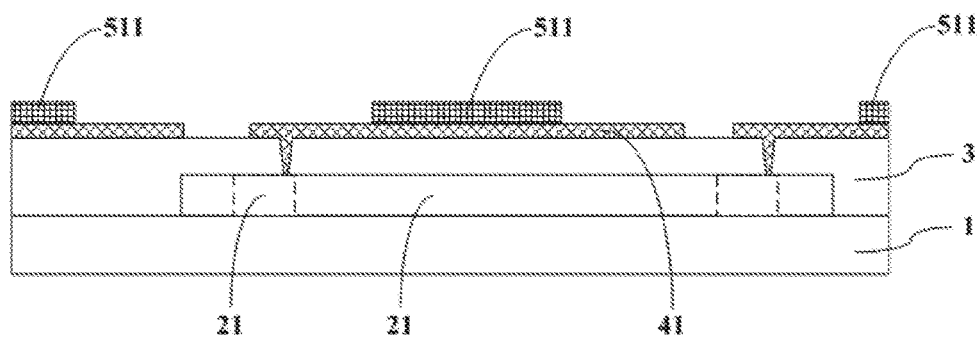
FIG. 8 is a schematic structural diagram corresponding to the removal of photoresist half-retention area in FIG. 7 provided by the present disclosure.

As shown in FIG. 8, removing the photoresist half-retention area 512; after removing the photoresist half-retention area 512, and then corresponding to the photoresist-mask pattern 51.

Figure 9:
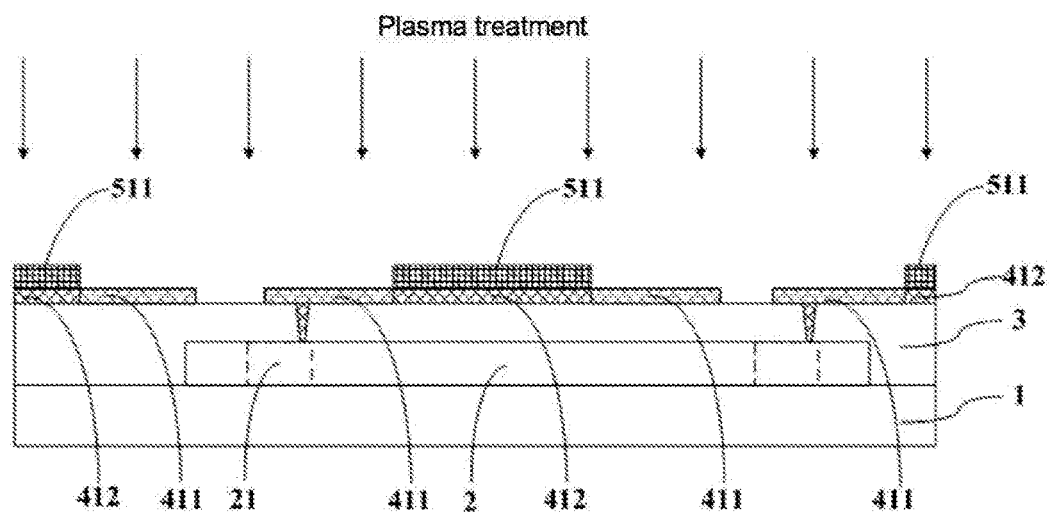
FIG. 9 is a schematic diagram of using a first gas for a portion of the anode pattern outside a photoresist full-retention area after performing a plasma treatment provided by the present disclosure.

As shown in FIG. 9, performing a plasma treatment to a portion of the anode pattern 41 outside the photoresist full-retention area 511 by adopting a first gas, wherein, the first gas comprises at least one of an $O_2$, $N_2O$, $CF_4$, and Ar; and removing the photoresist-mask pattern 51 acquires the OLED anode, and the OLED anode is the anode film layer 4 after being etched and performed a plasma treatment by a first gas. The OLED anode comprises an anode area 412 with a constant work function and an anode area 411 with an increased work function.

Wherein, the OLED anode is performed the plasma treatment with the first gas (ie, O2), which is ionization of the first gas, after the first gas is adsorbed on a surface of the anode pattern 41, an electron of the anode pattern 41 are transferred to an empty π*anti-bonding track of the first gas through an indium oxide and a tin oxide surface d orbital; therefore, the area where the plasma treatment is performed on the anode of the OLED through the first gas, which the surface is electron-deficient, and a Fermi level is reduced; therefore, the work function of the anode in the area is increased, a potential barrier between the anode and a hole injection layer is reduced, and an injection efficiency of the anode to the hole injection layer is increased.

An indium oxide ($In_2O_3$) is a semiconductor material that is widely used in optics and electrical devices. A conductivity of pure $In_2O_3$ crystal is poor, but people usually dope it to improve its conductivity. Wherein the most common doping element is an indium tin oxide (ITO) formed by a tin. ITO is a highly-integrated n-type semiconductor with a Fermi level above a conduction band, due to a substitutional doping of a Sn, excess electrons are formed at a doping site inside the crystal, and an oxygen vacancy is generated during the preparation of the ITO; therefore, it has a high carrier concentration and a low resistivity. In addition, a band gap of ITO is wide; therefore, an ITO film has a high transmittance to visible light and near infrared light. Due to the above unique properties, ITO is widely used in organic light-emitting devices (OLEDs), solar cells, flat panel displays, and transparent shielding materials and so on.

A hottest applied research is that the ITO material is used as the anode of the OLED display device to provide the holes, and the electrons generated from a metal cathode meet in the organic light-emitting layer to stimulate a photon. In the OLED display device, the carriers are injected into a light-emitting layer under an action of an electric field to recombine and lighten. The anode material is required to have a high surface work function and a good light transmittance to facilitate a stable performance of the OLED display device. A variety of surface treatment techniques and modification methods for the $In_2O_3$ and the ITO have been used to improve the surface work function of so as to promote a hole injection capability in OLED display devices.

Using an oxygen plasma to sputter the ITO film can prove that the surface hole injection efficiency of the $In_2O3$ and the ITO after the oxygen plasma treatment obviously increases, and a service life of the device is extended by two orders of magnitude. Moreover, the work function of the ITO treated by an $O_2$ and the $N_2O$ increases, and the work function of the ITO treated by the $N_2O$ is greater than that of $O_2$.

The ITO surface is performed the plasma treatment with an aim of improving a performance of the OLED display device. The OLED display device prepared by the ITO after $O_2$ and $CF_4$ treatment has a lower turn-on voltage and a lower current density under a same light emission than the OLED display device prepared without plasma treatment, which the improvement of these characteristics is related to a removal of pollutants on ITO surface and the increase of work function.

Figure 10A:
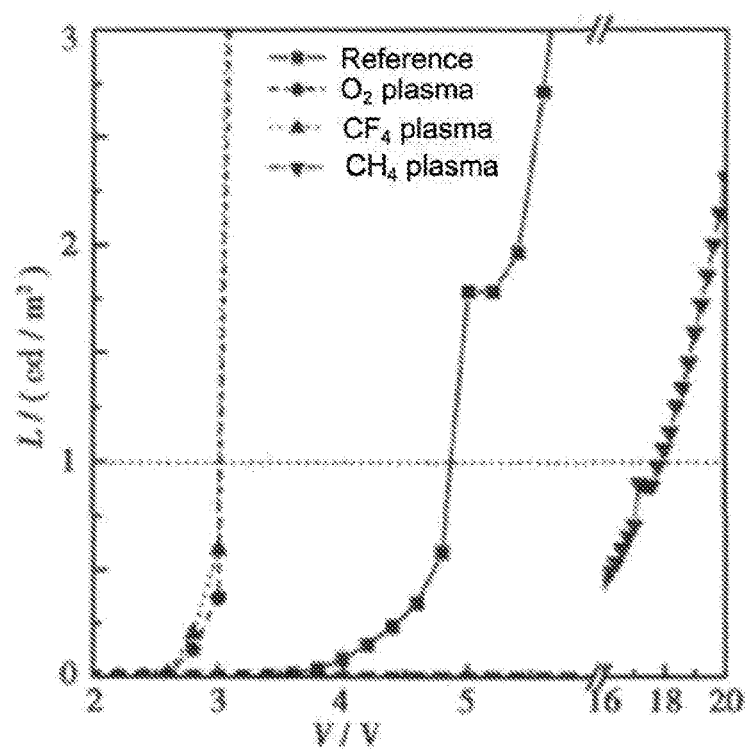
FIG. 10a is a characteristic diagram of a relationship between a brightness and a voltage corresponding to an OLED display device after an anode pattern is treated with $O_2$, $CF_4$ and $CH_4$ plasma respectively provided by the present disclosure.
Figure 10B:
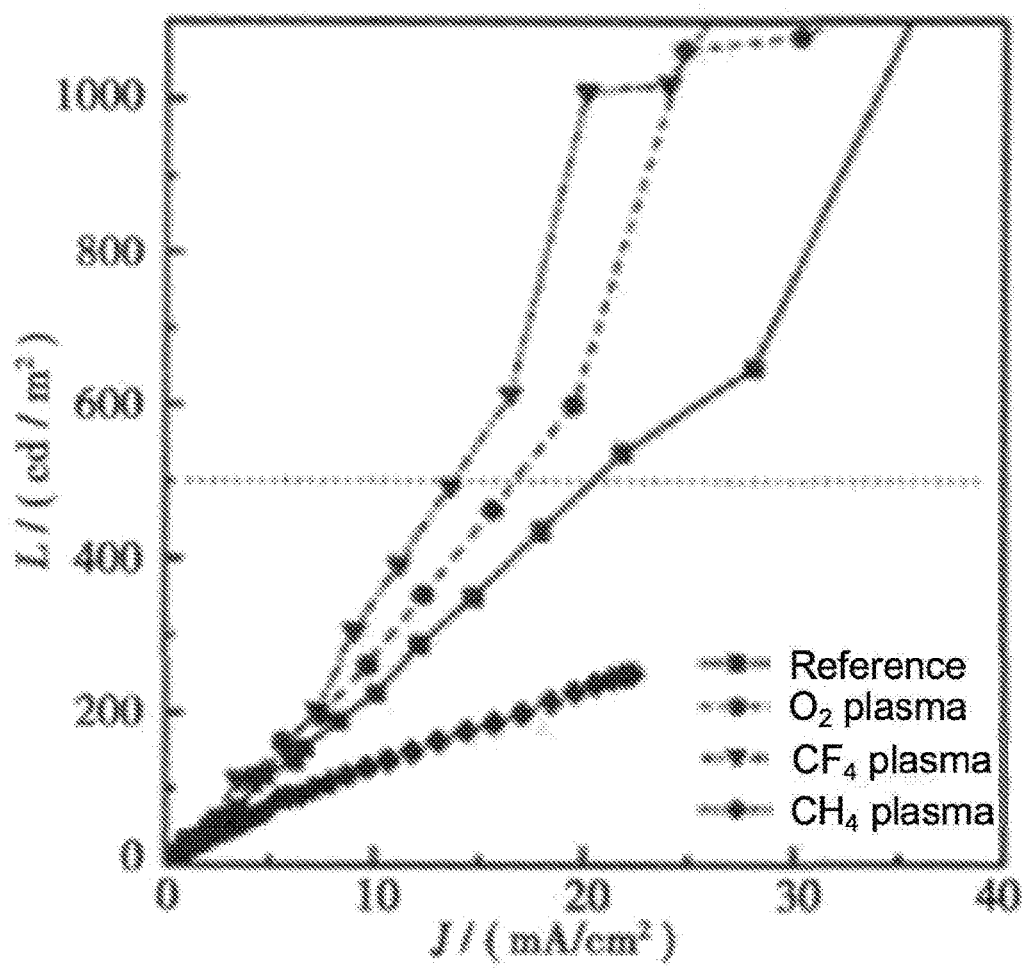
FIG. 10b is a characteristic diagram of a relationship between a brightness and a current density corresponding to an OLED display device after an anode pattern is treated with $O_2$, $CF_4$ and $CH_4$ plasma respectively provided by the present disclosure.

As shown in FIG. 10a, FIG. 10a shows the characteristic diagram of the relationship between a brightness and a voltage corresponding to the OLED display device after performing the plasma treatment on the anode pattern 41 of the ITO material by $O_2$, $CF_4$ and $CH_4$, respectively; as shown in FIG. 10a, FIG. 10a shows the characteristic diagram of the relationship between the brightness and a current density corresponding to the OLED display device after performing the plasma treatment on the anode pattern 41 of the ITO material by $O_2$, $CF_4$ and $CH_4$, respectively; therefore, the OLED display device prepared by performing the plasma treatment of the $O_2$ and the $CF_4$ on the anode pattern 41 has the higher brightness under a same current density than the OLED display devices prepared without performing the plasma treatment on the anode pattern 41.

Figure 11:
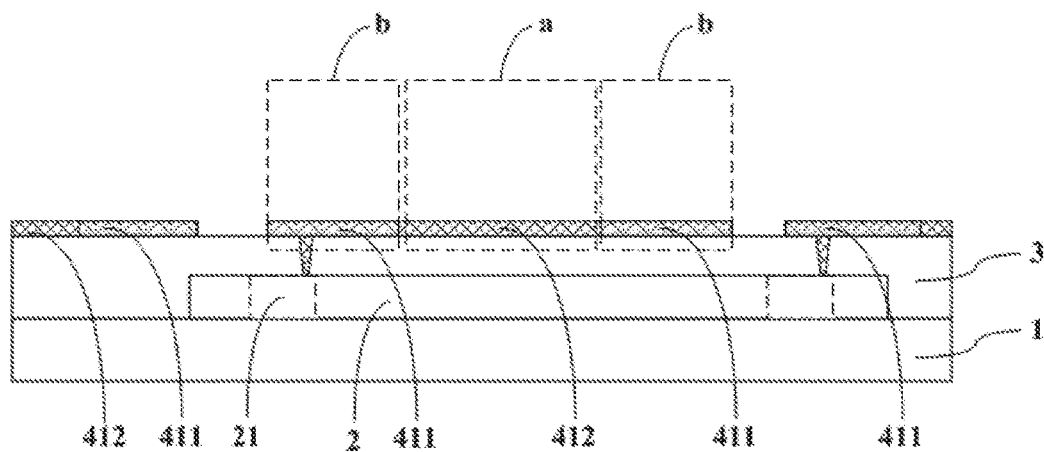
FIG. 11 is a schematic structural diagram of using a first gas for a portion of the anode pattern outside a photoresist full-retention area after performing a plasma treatment provided by the present disclosure.

As shown in FIG. 11, after the plasma treatment is completed, the OLED anode is divided into two parts: the anode region 412 which work function is protected by the photoresist full-retention area 511 and the anode region 411 which work function is increased at the peripheral portion of a light-emitting unit that is not protected by the photoresist full-retention area 511.

Figure 12:
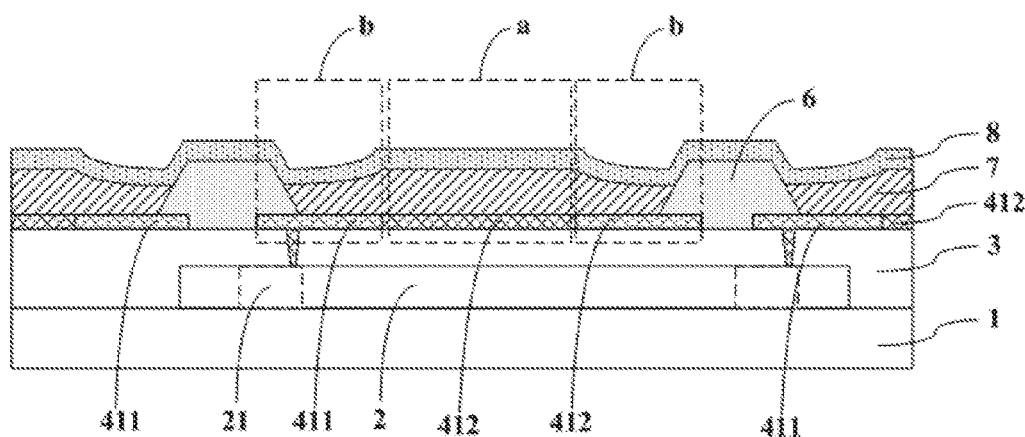
FIG. 12 is a schematic structural diagram of an OLED display device provided by the present disclosure.

When patterning the photoresist film layer 5, the photoresist half-retention area 512 is set between the photoresist full-retention area 511 and the photoresist full-removal area 513; and the anode film layer 4 corresponding to the photoresist full-removal area 513 is etched away to divide the anode film layer 4 into a plurality of the anode patterns 41, and the photoresist half-retention area 512 is located above the peripheral area of the anode pattern 41 while the photoresist full-retention area 511 is located above the middle area of the anode pattern 41 (that is, the inner area surrounded by the peripheral area), and the thickness of the organic light-emitting layer 7 is uneven, and the thickness of the organic light-emitting layer 7 above the peripheral area of the anode pattern 41 is generally smaller than the thickness of the organic light-emitting layer 7 above the middle of the anode pattern 41, as shown in FIG. 12, the upper part of the OLED anode protected by photoresist full-retention area 511 corresponds to the thicker part of the organic light-emitting layer 7, as shown in area a; the upper part of the OLED anode not protected by photoresist full-retention area 511 corresponds to the small thickness part of the organic light-emitting layer 7, as shown in area b; and the area a corresponds to the anode area 412 which work function is constant, and the area b corresponds to the anode area 411 which work function is increased.

Perform the plasma treatment to the portion of the anode pattern 41 for outside the photoresist full-retention area 511 by adopting the first gas can increase the injection efficiency of the portion of the anode pattern 41 to the hole injection layer; therefore, it can increase the brightness of the organic light-emitting layer 7 above the peripheral area of the anode pattern 41 to compensate for the display unevenness caused by the difference in the thickness of the organic light-emitting layer 7 and improve the display quality.

Further, patterning the photoresist film layer is specifically as:

Using the semi-transparent mask or the gray mask to expose the photoresist film layer 5, and the exposed photoresist film layer 5 is performed the developing process.

Further, forming the anode film layer 4 on the substrate 1 is specifically as:

Preparing the anode film layer 4 on the substrate 1 through by the magnetron sputtering and the thermal evaporation process.

Further, etching the anode film layer 4 is specifically as: Etching the anode film layer 4 by a wet-etching process.

Further, removing the photoresist half-retention area 512 is specifically as:

Performing a plasma-ashing treatment to the photoresist-mask pattern 51 by adopting a second gas, and removing the photoresist half-retention area, at the same time, the photoresist full-retention area 511 will also be attenuated, wherein the second gas is the mixed gas of $SF_6$ and $O_2$.

Further, performing a plasma-ashing treatment to the photoresist-mask pattern 51 by adopting a second gas is specifically as:

Transporting the second gas to a plasma etching apparatus, and using the plasma etching apparatus to ionize the second gas, and performing the plasma-ashing treatment to the photoresist-mask pattern by adopting an ionized second gas with a processing time of 30~50 seconds;

Wherein a top electrode power, a bottom electrode power and a chamber pressure of the plasma etching apparatus are respectively set as 6000~8000 W, 6000~8000 W and 200~250 mT, and a gas flow rate of $SF_6$ and $O_2$ in the second gas are 50-150 sccm and 5000-7000 sccm, respectively.

Preferably, the top electrode power, the bottom electrode (bias) power and the chamber pressure of the plasma etching apparatus are 7000 W, 7000 W, 180 mT, respectively, and the gas flow rate of the $SF_6$ and $O_2$ are 100 sccm and 6000 sccm, respectively, with the processing time of 40 s.

Further, performing a plasma treatment to a portion of the anode pattern 41 outside the photoresist full-retention area 511 by adopting a first gas is specifically as:

Transporting the first gas to the plasma etching apparatus, and using the plasma etching apparatus to ionize the first gas, and performing the plasma treatment to the portion of the anode pattern outside the photoresist full-retention area by adopting an ionized first gas with a processing time of 1~3 minutes to increase the work function of the portion of the anode film layer outside the photoresist full-retention area;

Wherein the top electrode power, the bottom electrode power and the chamber pressure of the plasma etching apparatus are respectively set as 1000~5000 W, 0 W and 100-300 mT, and the gas flow rate of the first gas is 1000~5000 sccm.

A reason why the bottom electrode (bias) power is 0 is to avoid damage caused by a plasma bombardment on the surface of the anode pattern 41 on the substrate 1.

The disclosure further provides the manufacturing method of an OLED display device, which the method comprises following steps:

As shown in FIG. 12, forming the TFT array layer 2 on the substrate 1;

Forming the flat layer 3 on the substrate 1, and the flat layer 3 covering the TFT array layer 2;

Forming the hole 9 on the flat layer 3;

Preparing the anode on the flat layer 3, and the anode electrically connects to the TFT array layer 2 through the hole 9;

Forming the pixel defining layer 6 on the anode;

Forming the organic light-emitting layer 7 on the pixel defining layer 6;

Forming the cathode 8 on the organic light-emitting layer 7.

Further, forming the pixel defining layer 6 on the anode comprises the following steps:

Forming the organic insulating resin layer on the anode;

Acquiring the by lithographically exposing the organic insulating resin layer

Forming the cathode 8 on the organic light-emitting layer 7 is specifically as:

Forming the cathode on the organic light-emitting layer 7 by the evaporation method is more specifically as: an OLED cathode material, such as an aluminum or a magnesium aluminum alloy, is deposited on the organic light-emitting layer 7 to form the cathode 8.

Electrically connecting between the anode and the TFT array layer 2 through the hole 9 is specifically as:

Electrically drain electrode 21 connecting between the anode and the TFT array layer 2 through the hole 9.

Further, forming the organic light-emitting layer 7 on the pixel defining layer 6 is specifically as:

Forming the organic light-emitting layer 7 on the pixel defining layer 6 by the evaporation method.

The organic light-emitting layer 7 comprises at least one layer of the hole injection layer, the hole transport layer, the light-emitting layer, the hole blocking layer, the electron blocking layer, the electron transport layer and the electron injection layer.

In summary, in the present disclosure, the anode corresponding to the portion with the smaller thickness of the organic light-emitting layer 7 of the OLED display device is performed the plasma treatment with at least one gas of the $O_2$, $N_2O$, $CF_4$ and Ar to increase the work function of the anode corresponding to the portion with the smaller thickness of the organic light-emitting layer 7, therefore, it increases the injection efficiency of the portion of the anode to the hole injection layer, and also increase the brightness of the portion of the small thickness of organic light-emitting layer 7 to compensate for the display unevenness caused by the difference in the thickness of the organic light-emitting layer 7 and improve the display quality.

The above content is a further detailed description of the present disclosure related to the specific preferred embodiments, and it should not be considered that the specific implementation of the present disclosure is limited to these descriptions.

For those of general skill in the art to which the present disclosure pertains, under the premise without departing from the concept of the present disclosure, any other simple deductions or replacements should also be considered as belonging to the protection scope of the present disclosure.

What is claimed is:

1. A manufacturing method of an OLED anode, comprising following steps:
forming an anode film layer on a substrate, wherein a material of the anode film layer is an ITO material;
forming a photoresist film layer on the anode film layer;
patterning the photoresist film layer to acquire a photoresist-mask pattern, the photoresist-mask pattern comprising: a photoresist full-retention area, a photoresist half-retention area, and a photoresist full-removal area, wherein the photoresist half-retention area is located between the photoresist full-retention area and the photoresist full-removal area;
using the photoresist-mask pattern as an anti-etching layer, and etching the anode film layer to acquire an anode pattern;
removing the photoresist half-retention area;
performing a plasma treatment to a portion of the anode pattern outside the photoresist full-retention area by adopting a first gas, wherein, the first gas comprises at least one of an $O_2$, $N_2O$, $CF_4$, and Ar, and
removing the photoresist-mask pattern.

2. The manufacturing method of an OLED anode according to claim 1, wherein, patterning the photoresist film layer is specifically as:
using a semi-transparent mask or a gray mask to expose and develop the photoresist film layer.

3. The manufacturing method of an OLED anode according to claim 1, wherein forming an anode film layer on the substrate is specifically as:
preparing the anode film layer on the substrate by a magnetron sputtering and a thermal evaporation process.

4. The manufacturing method of an OLED anode according to claim 1, wherein etching the anode film layer is specifically as:
etching the anode film layer by a wet-etching process.

5. The manufacturing method of an OLED anode according to claim 1, wherein, performing a plasma treatment to a portion of the anode pattern outside the photoresist full-retention area by adopting the first gas is specifically as:
transporting the first gas to the plasma etching apparatus, and using the plasma etching apparatus to ionize the first gas, and performing the plasma treatment to the portion of the anode pattern outside the photoresist full-retention area by adopting an ionized first gas with a processing time of 1~3 minutes to increase a work function of the portion of the anode film layer outside the photoresist full-retention area;
wherein the top electrode power, a bottom electrode power and a chamber pressure of the plasma etching apparatus are respectively set as 1000~5000 W, 0 W, and 100-300 mT, and a gas flow rate of the first gas is 1000~5000 sccm.

6. The manufacturing method of an OLED anode according to claim 1, wherein removing the photoresist half-retention area is specifically as:
performing a plasma-ashing treatment to the photoresist-mask patter by adopting a second gas, and removing the photoresist half-retention area, wherein the second gas is a mixed gas of $SF_6$ and $O_2$.

7. The manufacturing method of an OLED anode according to claim 6, wherein performing a plasma-ashing treatment to the photoresist-mask patter by adopting a second gas is specifically as:
transporting the second gas to a plasma etching apparatus, and using the plasma etching apparatus to ionize the second gas, and performing the plasma-ashing treatment to the photoresist-mask patter by adopting an ionized second gas with a processing time of 30~50 seconds;
wherein a top electrode power, a bottom electrode power and a chamber pressure of the plasma etching apparatus are respectively set as 6000~8000 W, 6000~8000 W, and 200~250 mT, and a gas flow rate of $SF_6$ and $O_2$ in the second gas which a range are 50-150 sccm and 5000-7000 sccm, respectively.

8. A manufacturing method of an OLED anode, comprising following steps:
forming an anode film layer on a substrate, wherein a material of the anode film layer is an ITO material;
forming a photoresist film layer on the anode film layer;
pattering the photoresist film layer to acquire a photoresist-mask pattern, the photoresist-mask pattern comprising: a photoresist full-retention area, a photoresist half-retention area, and a photoresist full-removal area, wherein the photoresist half-retention area is located between the photoresist full-retention area and the photoresist full-removal area;
using the photoresist-mask pattern as an anti-etching layer, and etching the anode film layer to acquire an anode pattern;
removing the photoresist half-retention area;
performing a plasma treatment to a portion of the anode pattern outside the photoresist full-retention area by adopting a first gas, wherein, the first gas comprises at least one of an $O_2$, $N_2O$, $CF_4$, and Ar; and
removing the photoresist-mask pattern;
removing the photoresist half-retention area is specifically as:
performing a plasma-ashing treatment to the photoresist-mask pattern by adopting a second gas, and removing the photoresist half-retention area, wherein the second gas is a mixed gas of $SF_6$ and $O_2$.

9. The manufacturing method of an OLED anode according to claim 8, wherein, patterning the photoresist film layer is specifically as follows:
using a semi-transparent mask or a gray mask to expose and develop the photoresist film layer.

10. The manufacturing method of an OLED anode according to claim 8, wherein forming the anode film layer on the substrate is specifically as:
preparing the anode film layer on the substrate by a magnetron sputtering and a thermal evaporation process.

11. The manufacturing method of an OLED anode according to claim 8, wherein, etching the anode film layer is specifically as:
etching the anode film layer by a wet-etching process.

12. The manufacturing method of an OLED anode according to claim 8, wherein performing a plasma-ashing treatment to the photoresist-mask pattern by adopting a second gas is specifically as:
transporting the second gas to a plasma etching apparatus, and using the plasma etching apparatus to ionize the second gas, and performing the plasma-ashing treatment to the photoresist-mask pattern by adopting an ionized second gas with a processing time of 30~50 seconds;
wherein a top electrode power, a bottom electrode power and a chamber pressure of the plasma etching apparatus are respectively set as 6000~8000 W, 6000~8000 W, and 200~250 mT, and a gas flow rate of $SF_6$ and $O_2$ in the second gas which a range are 50-150 sccm and 5000-7000 sccm, respectively.

13. The manufacturing method of an OLED anode according to claim 8, wherein, performing a plasma treatment to a portion of the anode pattern outside the photoresist full-retention area by adopting the first gas is specifically as:
    transporting the first gas to the plasma etching apparatus, and using the plasma etching apparatus to ionize the first gas, and performing the plasma treatment to the portion of the anode pattern outside the photoresist full-retention area by adopting an ionized first gas with a processing time of 1~3 minutes to increase a work function of the portion of the anode film layer outside the photoresist full-retention area;
    wherein the top electrode power, a bottom electrode power and a chamber pressure of the plasma etching apparatus are respectively set as 1000~5000 W, 0 W, and 100-300 mT, and a gas flow rate of the first gas is 1000~5000 sccm.

14. A manufacturing method of an OLED display device, wherein comprising following steps:
    forming a TFT array layer on a substrate;
    forming a flat layer on the substrate, and the flat layer covering the TFT array layer;
    forming a hole on the flat layer;
    preparing an anode on the flat layer, and the anode electrically connects to the TFT array layer through the hole;
    forming a pixel defining layer on the anode;
    forming an organic light-emitting layer on the pixel defining layer;
    forming a cathode on the organic light-emitting layer;
    wherein preparing the anode on the flat layer comprises the following steps:
    forming an anode film layer on a substrate, wherein a material of the anode film layer is an ITO material;
    forming a photoresist film layer on the anode film layer;
    patterning the photoresist film layer to acquire a photoresist-mask pattern, the photoresist-mask pattern comprising: a photoresist full-retention area, a photoresist half-retention area, and a photoresist full-removal area, wherein the photoresist half-retention area is located between the photoresist full-retention area and the photoresist full-removal area;
    using the photoresist-mask pattern as an anti-etching layer, and etching the anode film layer to acquire an anode pattern;
    removing the photoresist half-retention area;
    performing a plasma treatment to a portion of the anode patter outside the photoresist full-retention area by adopting a first gas, wherein, the first gas comprises at least one of an $O_2$, $N_2O$, $CF_4$, and Ar; and
    removing the photoresist-mask pattern.

15. The manufacturing method of an OLED display device according to claim 14, wherein, forming the pixel defining layer on the anode comprises the following steps:
    forming an organic insulating resin layer on the anode;
    acquiring the pixel defining layer by lithographically exposing the organic insulating resin layer;
    forming the cathode on the organic light-emitting layer is specifically as:
    forming the cathode on the organic light-emitting layer by an evaporation method;
    electrically connecting between the anode and the TFT array layer through the hole is specifically as:
    electrically drain electrode connecting between the anode and the TFT array layer through the hole.

16. The manufacturing method of an OLED display device according to claim 14, wherein, forming the organic light-emitting layer on the pixel defining layer is specifically as:
    forming the organic light-emitting layer on the pixel defining layer by the evaporation method;
    the organic light-emitting layer comprises at least one layer of a hole injection layer, a hole transport layer, a light-emitting layer, a hole blocking layer, an electron blocking layer, an electron transport layer and an electron injection layer.

17. The manufacturing method of an OLED display device according to claim 14, wherein, patterning the photoresist film layer is specifically as:
    using a semi-transparent mask or a gray mask to expose and develop the photoresist film layer;
    forming the anode film layer on the substrate is specifically as:
    preparing an anode film layer on the substrate by a magnetron sputtering and a thermal evaporation process.

18. The manufacturing method of an OLED display device according to claim 14, wherein, performing a plasma treatment to a portion of the anode pattern outside the photoresist full-retention area by adopting the first gas is specifically as:
    transporting the first gas to the plasma etching apparatus, and using the plasma etching apparatus to ionize the first gas, and performing the plasma treatment to the portion of the anode pattern outside the photoresist full-retention area by adopting an ionized first gas with a processing time of 1~3 minutes to increase a work function of the portion of the anode film layer outside the photoresist full-retention area;
    wherein the top electrode power, a bottom electrode power and a chamber pressure of the plasma etching apparatus are respectively set as 1000~5000 W, 0 W, and 100-300 mT, and a gas flow rate of the first gas is 1000~5000 sccm.

19. The manufacturing method of an OLED display device according to claim 14, wherein, etching the anode film layer is specifically as:
    etching the anode film layer by a wet-etching process;
    removing the photoresist half-retention area is specifically as:
    performing a plasma-ashing treatment to the photoresist-mask pattern by adopting a second gas, and removing the photoresist half-retention area, wherein the second gas is a mixed gas of $SF_6$ and $O_2$.

20. The manufacturing method of an OLED display device according to claim 19, wherein performing a plasma-ashing treatment to the photoresist-mask patter by adopting a second gas is specifically as:
    transporting the second gas to a plasma etching apparatus, and using the plasma etching apparatus to ionize the second gas, and performing the plasma-ashing treatment to the photoresist-mask pattern by adopting an ionized second gas with a processing time of 30~50 seconds;
    wherein a top electrode power, a bottom electrode power and a chamber pressure of the plasma etching apparatus are respectively set as 6000~8000 W, 6000~8000 W, and 200~250 mT, and a gas flow rate of $SF_6$ and $O_2$ in the second gas which a range are 50-150 sccm and 5000-7000 sccm, respectively.

* * * * *